(12) United States Patent
Wang et al.

(10) Patent No.: US 10,804,346 B2
(45) Date of Patent: Oct. 13, 2020

(54) DISPLAY PANEL, DISPLAY DEVICE AND DRIVING METHOD FOR DISPLAY DEVICE

(71) Applicant: Shanghai Tianma AM-OLED Co., Ltd., Shanghai (CN)

(72) Inventors: Xue Wang, Shanghai (CN); Haimin Liu, Shanghai (CN); Zhiyong Xiong, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/423,437

(22) Filed: May 28, 2019

(65) Prior Publication Data

US 2020/0135817 A1  Apr. 30, 2020

(30) Foreign Application Priority Data

Oct. 31, 2018  (CN) .......................... 2018 1 1288120

(51) Int. Cl.
*H01L 27/32* (2006.01)
*G02B 27/09* (2006.01)
*H01L 51/52* (2006.01)

(52) U.S. Cl.
CPC ...... *H01L 27/3246* (2013.01); *G02B 27/0955* (2013.01); *H01L 51/5206* (2013.01); *H01L 51/5221* (2013.01)

(58) Field of Classification Search
CPC ............. H01L 51/5206; H01L 27/3246; H01L 51/5221; G02B 27/0955
See application file for complete search history.

(56) References Cited

U.S. PATENT DOCUMENTS

2010/0043780 A1* 2/2010 Lin ..................... H01L 31/0543
126/698
2011/0173080 A1* 7/2011 Kutsumi ............ G06Q 30/0241
705/14.73

(Continued)

FOREIGN PATENT DOCUMENTS

| CN | 104570449 A | 4/2015 |
|---|---|---|
| CN | 107728361 A | 2/2018 |
| CN | 108376696 A | 8/2018 |

OTHER PUBLICATIONS

Chinese Office Action dated Jun. 1, 2020 for corresponding Chinese Patent Application No. 201811288120.0, and English translation.

*Primary Examiner* — Abbas I Abdulselam
(74) *Attorney, Agent, or Firm* — Tarolli, Sundheim, Covell & Tummino LLP

(57) ABSTRACT

The present disclosure provides a display panel, a display device, and a method for driving a display device. The display panel has a display region, a partial region of which is reused as a photographing photosensitive region. The display panel includes: a first substrate; a second substrate disposed opposite to the first substrate; a plurality of pixel units disposed in the display region, and a plurality of photosensitive elements disposed in the photographing photosensitive region. The first substrate is located on a side of the second substrate facing a light-emitting surface, the plurality of pixel units is formed on the second substrate, each of the plurality of pixel units includes a pixel circuit and a light-emitting element, and a planarization layer is arranged between the pixel circuit and the light-emitting element, and the plurality of photosensitive elements is located on a side of the planarization layer facing the first substrate.

16 Claims, 7 Drawing Sheets

(56) References Cited

U.S. PATENT DOCUMENTS

| | | | |
|---|---|---|---|
| 2014/0217384 A1* | 8/2014 | Nakamura | H01L 27/3269 |
| | | | 257/40 |
| 2017/0330866 A1* | 11/2017 | Tseng | H01L 25/167 |
| 2018/0088372 A1* | 3/2018 | Wang | G02F 1/1303 |
| 2019/0363107 A1* | 11/2019 | Matsusaki | H01L 27/322 |

\* cited by examiner

DISPLAY PANEL, DISPLAY DEVICE AND DRIVING METHOD FOR DISPLAY DEVICE

CROSS-REFERENCE TO RELATED APPLICATIONS

The present application claims priority to Chinese Patent Application No. 201811288120.0, filed on Oct. 31, 2018, the content of which is incorporated herein by reference in its entirety.

TECHNICAL FIELD

The present disclosure relates to the field of display technologies, and in particular, to a display panel, a display device, and a method for driving a display device.

BACKGROUND

With the continuous development of display technologies, a display panel has more and more functions. In addition to an image display function, the display panel can further achieve a photographing function.

In the related art, a display panel includes a display region and a border region surrounding the display region, and a camera assembly is usually arranged in the border region. With such an arrangement, on the one hand, a position of the camera assembly is limited due to a limited width of the border region; and on the other hand, the camera assembly occupies space in the border region, which is not conducive to achieving a high screen occupancy ratio of the display panel.

SUMMARY

In view of this, the present disclosure provides a display panel, a display device, and a method for driving the display device, aiming to improve the screen occupancy ratio of the display panel, reduce loss of ambient light during the imaging process, and improve the imaging quality.

In an aspect, the present disclosure provides a display panel. The display panel has a display region. A partial region of the display region is reused as a photographing photosensitive region. The display panel includes: a first substrate; a second substrate disposed opposite to the first substrate; a plurality of pixel units disposed in the display region; and a plurality of photosensitive elements disposed in the photographing photosensitive region. The first substrate is located on a side of the second substrate facing a light-emitting surface of the display panel, the plurality of pixel units is formed on the second substrate, each of the plurality of pixel units comprises a pixel circuit and a light-emitting element, and a planarization layer is arranged between the pixel circuit and the light-emitting element, and the plurality of photosensitive elements is located on a side of the planarization layer facing the first substrate.

In another aspect, the present disclosure provides a display device. The display device includes: the abovementioned display panel, a mode determining unit configured to determine whether the display panel is in a photographing mode, and a control unit electrically connected to the mode determining unit and configured to: when the display panel is in the photographing mode, control some of the plurality of pixel units arranged in a part of the display region other than the photographing photosensitive region to emit light, control some of the plurality of pixel units arranged in the photographing photosensitive region not to emit light, and generate an image according to electrical signals generated by the plurality of photosensitive elements; and when the display panel is not in the photographing mode, control the plurality of pixel units in the display region to emit light.

In still another aspect, the present disclosure provides a method for diving a display device, and the method is applied to the abovementioned display device. The method includes: step S1 of determining, by the mode determining unit, whether the display panel is in the photographing mode, if yes, proceeding to step S2, and if not, proceeding to step S3; step S2 of controlling, by the control unit, some of the plurality of pixel units arranged in the part of the display region other than the photographing photosensitive region to emit light and some of the plurality of pixel units arranged in the photographing photosensitive region not to emit light, and generating, by the control unit, an image based on electrical signals generated by the plurality of photosensitive elements; and step S3 of controlling, by the control unit, the plurality of pixel units in the display region to emit light.

BRIEF DESCRIPTION OF DRAWINGS

In order to more clearly illustrate technical solutions in embodiments of the present disclosure or in the related art, the accompanying drawings used in the embodiments are briefly introduced as follows. It should be noted that the drawings described as follows are merely part of the embodiments of the present disclosure, other drawings can also be acquired by those skilled in the art without paying creative efforts.

DETAILED DESCRIPTION

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure will fall within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although an etch hole may be described using the terms of "first", "second", etc., in the embodiments of the present disclosure, the etch hole will not be limited to these terms. These terms are merely used to distinguish etch holes from one another. For example, without departing from the scope of the embodiments of the present disclosure, a first etch hole may also be referred to as a second etch hole, and similarly, a second etch hole may also be referred to as a first etch hole.

Figure 1:
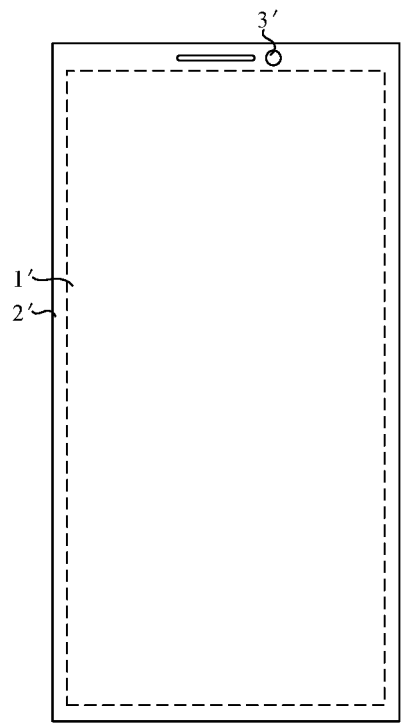
FIG. 1 is a schematic structural diagram of a display panel according to the related art.

FIG. 1 is a schematic structural view of a display panel according to the related art. As shown in FIG. 1, the display panel includes a display region 1' and a border region 2' surrounding the display region, and a camera assembly 3' is usually arranged in the border region 2'. With such an arrangement, on the one hand, a position of the camera assembly 3' is limited due to a limited width of the border region 2'; and on the other hand, the camera assembly 3' occupies space in the border region 2', which is not conducive to a high screen occupancy ratio of the display panel.

Figure 2:
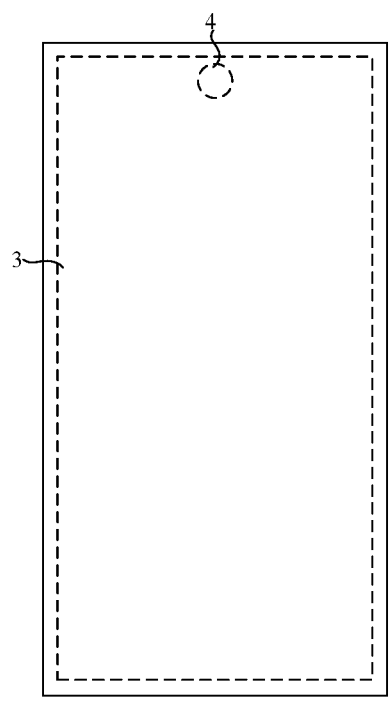
FIG. 2 is a top view of a display panel according to an embodiment of the present disclosure.
Figure 3:
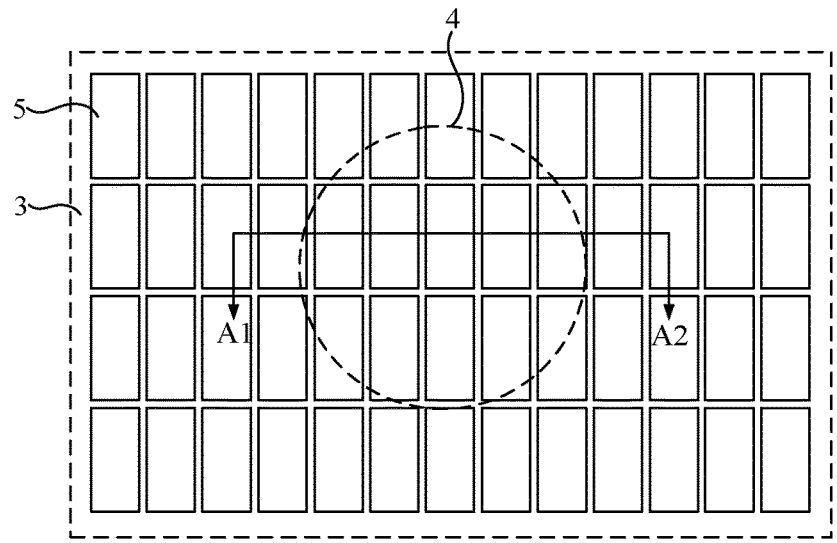
FIG. 3 is an enlarged view of part of FIG. 2.
Figure 4:
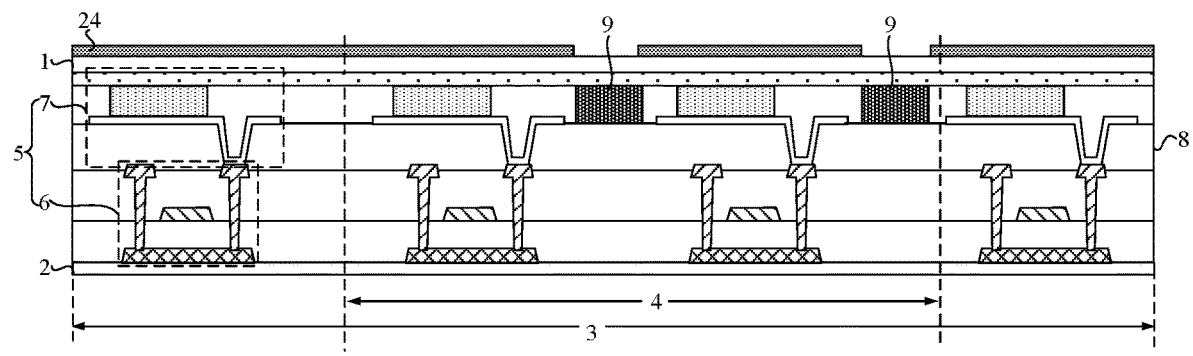
FIG. 4 is a cross-sectional view of FIG. 3 along line A1-A2.

An embodiment of the present disclosure provides a display panel. FIG. 2 is a top view of a display panel according to an embodiment of the present disclosure; FIG. 3 is an enlarged view of part of FIG. 2; and FIG. 4 is a cross-sectional view of FIG. 3 along line A1-A2. As shown in FIG. 2 to FIG. 4, the display panel includes a first substrate 1 and a second substrate 2 that are disposed opposite to each other. The first substrate 1 is located on a side of the second substrate 2 facing a light-emitting surface. The display panel further includes a display region 3. A partial region of the display region 3 is reused as a photographing photosensitive region 4. A plurality of pixel units 5 is arranged in the display region 3, and the plurality of pixel units 5 is formed on the second substrate 2. Each pixel unit 5 includes a pixel circuit 6 and a light-emitting element 7. A planarization layer 8 is disposed between the pixel circuit 6 and the light-emitting element 7. A plurality of photosensitive elements 9 is arranged in the photographing photosensitive region 4, and the plurality of photosensitive elements 9 is located on a side of the planarization layer 8 facing the first substrate 1.

When the display panel is not in the photographing mode, the pixel unit 5 in the display region 3 emits light, and the photosensitive element 9 does not work. When the display panel is in a photographing mode, the pixel unit 5 in the display region 3 other than the photographing photosensitive region 4 emits light, the pixel unit 5 in the photographing photosensitive region 4 does not emit light, and the photosensitive element 9 converts ambient light into an electrical signal and then an image is generated based on the electrical signal generated by the photosensitive element 9.

For the display panel provided by this embodiment of the present disclosure, a partial region of the display region 3 is reused as the photographing photosensitive region 4, and the photosensitive element 9 is integrated in the photographing photosensitive region 4. In this way, on the one hand, the photosensitive element 9 does not need to additionally occupy space in the border region, and thus the screen occupancy ratio of the display panel is improved and a narrow border of the display panel can be better achieved. On the other hand, based on the working principle of the pixel unit 5 and the photosensitive element 9 in the photographing photosensitive region 4, the image display function can be implemented in the photographing photosensitive region 4 when it is not in the photographing mode and the photographing function can be implemented in the photographing mode in the photographing photosensitive region 4. Then, when the display panel displays an image, the image presented in the display region 3 is a complete image. Compared with that a partial region of the display region 3 is merely used as the photographing photosensitive region 4 and only the photographing function is implemented in the photographing photosensitive region 4, this embodiment can avoid the problem that the user's viewing experience is not good because the photographing photosensitive region 4 does not display the image.

In addition, the photosensitive element 9 is arranged on the side of the planarization layer 8 facing the first substrate 1 such that the photosensitive element 9 is closer to the first substrate 1. When the display panel is in the photographing mode, a path through which the ambient light passes from the first substrate 1 to the photosensitive element 9 is short and involves a small number of layers, and thus loss of the ambient light can be reduced and the amount of light reaching the photosensitive element 9 can be increased, thereby improving the imaging quality.

Figure 5:
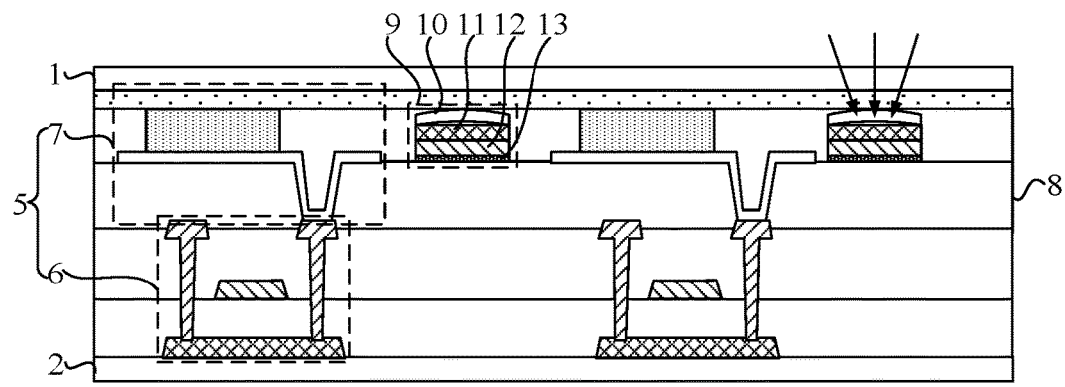
FIG. 5 is a schematic structural diagram illustrating a photosensitive element according to an embodiment of the present disclosure.

FIG. 5 is a schematic structural diagram illustrating a photosensitive element according to an embodiment of the present disclosure. In the embodiment, as shown in FIG. 5, in a direction from the first substrate 1 towards the second substrate 2, the photosensitive element 9 includes sequentially a convex lens 10, an infrared filter 11, a sensor 12 and a signal transmission line 13. The ambient light is transmitted to the infrared filter 11 through the convex lens 10. The infrared filter 11 filters out infrared light in the ambient light, and the filtered ambient light is converted into an electrical signal through the sensor 12, and then the electrical signal is transmitted to a structure for generating an image through the signal transmission line 13.

It should be noted that the image formed by the electrical signal generated by each photosensitive element 9 is an image corresponding to a partial region, and it is needed to integrate multiple independent images to generate a complete image for the final imaging.

The photosensitive element 9 can be integrated in the pixel unit 5, that is, the photosensitive element 9 is embedded in a layer where the pixel unit 5 is located. Alternatively, the photosensitive element 9 can be disposed outside the pixel unit 5, that is, the photosensitive element 9 is disposed on a side of the layer, where the pixel unit 5 is located, facing the first substrate 1.

Figure 6:
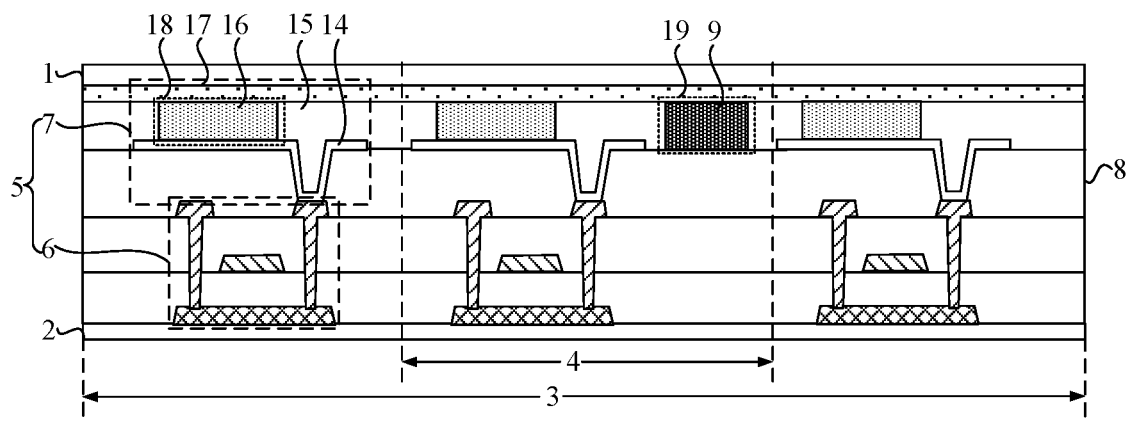
FIG. 6 is a schematic diagram illustrating an arrangement of a photosensitive element according to an embodiment of the present disclosure.

FIG. 6 is a schematic diagram illustrating an arrangement of a photosensitive element according to an embodiment of the present disclosure. In the embodiment, when the photosensitive element 9 is integrated in the pixel unit 5, as shown in FIG. 6, the light-emitting element 7 includes an anode layer 14, a pixel definition layer 15, a light-emitting layer 16 and a cathode layer 17. Herein, the anode layer 14 is located on a side of the planarization layer 8 facing away from the second substrate 2, the pixel definition layer 15 is located on a side of the anode layer 14 facing away from the planarization layer 8, and the cathode layer 17 is located on a side of the pixel definition layer 15 facing away from the second substrate 2. The pixel definition layer 15 has a first etch hole 18, and the light-emitting layer 16 is located in the first etch hole 18. The pixel definition layer 15 located in the photographing photosensitive region 4 further has a second etch hole 19, and the photosensitive element 9 is located in the second etch hole 19.

In the manufacturing process of the display panel, after the pixel definition layer 15 is formed, the first etch hole 18 and the second etch hole 19 are formed in the pixel definition layer 15 by an etching process, and then the light-emitting layer 16 is formed in the first etch hole 18 by evaporation, and the photosensitive element 9 is arranged in the second etch hole 19.

The photosensitive element 9 is arranged in the second etch hole 19 of the pixel definition layer 15. In this way, on the one hand, the photosensitive element 9 and the light-emitting layer 16 are located in a same layer without additional layer space, which can avoid thickness increase of the display panel due to the arrangement of the photosensitive element 9, thereby achieving a lighter and thinner display panel. On the other hand, since the photosensitive element 9 is close to the first substrate 1, when the display panel is in the photographing mode, the path through which the ambient light passes from the first substrate 1 to the photosensitive element 9 is short and involves a small number of layers. Thus, loss of the ambient light can be reduced and the amount of light reaching the photosensitive element 9 can be increased, thereby improving the imaging quality Further, with reference to FIG. 6, an orthographic projection of the cathode layer 17 on the second substrate 2 covers the display region 3. The cathode layer 17 is made of a transparent conductive material such as indium tin oxide, indium zinc oxide or indium gallium zinc oxide. In this case, the photosensitive element 9 is located between the planarization layer 8 and the cathode layer 17. When the cathode layer 17 is made of a transparent conductive material, the cathode layer 17 has a good light transmission performance, and the ambient light passing through the cathode layer 17 can have a very small loss, which is nearly negligible. Thus, there is no adverse effect on the imaging quality even if the photosensitive element 9 is located between the planarization layer 8 and the cathode layer 17.

Figure 7:
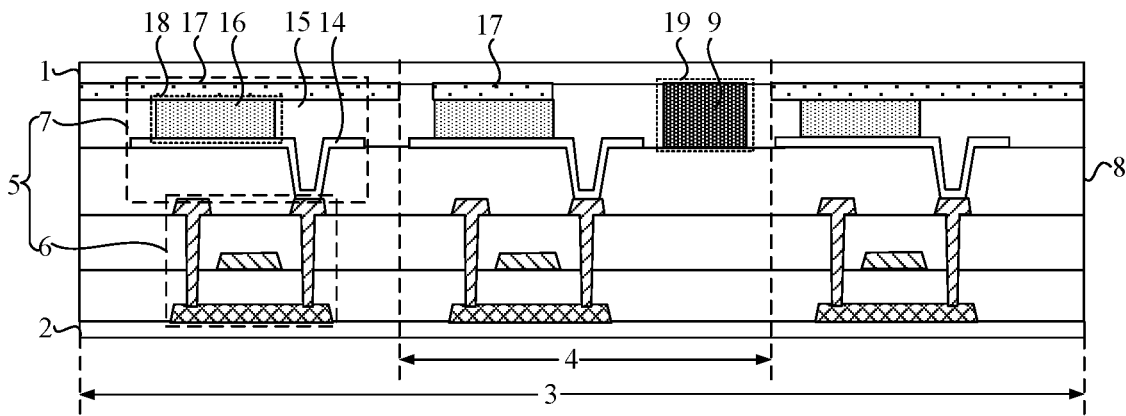
FIG. 7 is a schematic diagram illustrating another arrangement of a photosensitive element according to an embodiment of the present disclosure.

As shown in FIG. 7, which is a schematic diagram illustrating another arrangement of a photosensitive element according to an embodiment of the present disclosure, an orthographic projection of the cathode layer 17 in the photographing photosensitive region 4 on the second substrate 2 overlaps with an orthographic projection of the light-emitting layer 16 on the second substrate 2. In this case, the photosensitive element 9 is located between the planarization layer 8 and the first substrate 1. A part of the cathode layer 17 in the photographing photosensitive region 4 corresponding to the photosensitive element 9 is hollowed out, and the remaining of the cathode layer 17 is still in a planar structure, so that the cathode layer 17 does not block the photosensitive element 9. In this way, loss of the ambient light in the process of entering the photosensitive element 9 can be further reduced, and the cathode layer 17 can be made of a material within an increased range. For example, the cathode layer 17 can be made of a transparent conductive material or a metal material.

Figure 8:
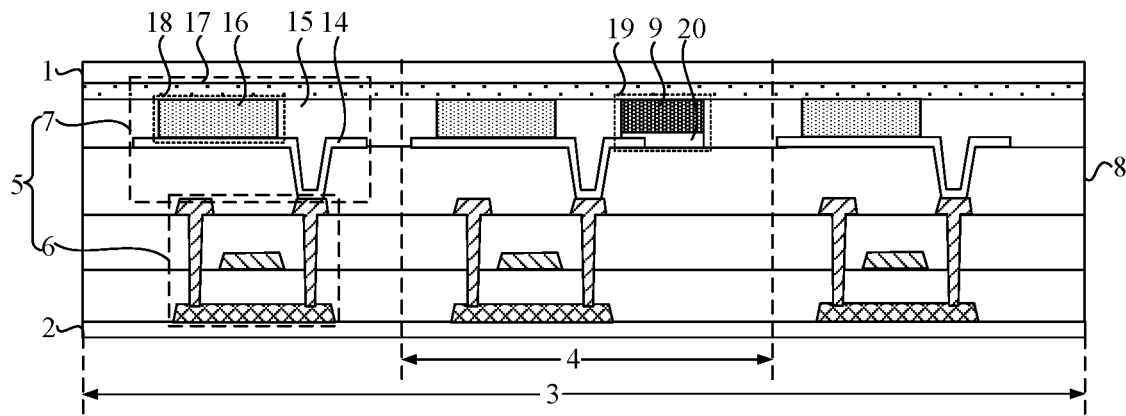
FIG. 8 is a schematic diagram illustrating still another arrangement of a photosensitive element according to an embodiment of the present disclosure.

FIG. 8 is a schematic diagram illustrating still another arrangement of a photosensitive element according to an embodiment of the present disclosure. Further, as shown in FIG. 8, when a portion of the anode layer 14 is located in the second etch hole 19, an insulation layer 20 is arranged in the second etch hole 19 and located between the photosensitive element 9 and the anode layer 14, so as to prevent the anode layer 14 from directly contacting the photosensitive element 9, which would otherwise result in that the anode layer 14 interferes with the electrical signal generated by the photosensitive element 9 and thus normal imaging may be affected.

Generally, the photosensitive element 9 has a small size parallel to a plane of the display panel, which is only approximately 2 μm. Therefore, a plurality of photosensitive elements 9 can be integrated in each pixel unit 5 in the photographing photosensitive region 4, so as to improve the imaging accuracy. For example, M photosensitive elements 9 can be integrated in each pixel unit 5 in the photographing photosensitive region 4, where $10 \leq M \leq 50$.

It should be noted that, when a plurality of photosensitive elements 9 is integrated in each pixel unit 5, the photosensitive elements 9 can be dispersedly disposed in a non-aperture region of the pixel unit 5. The arrangement manner of the photosensitive elements 9 is not limited in the embodiments of the present disclosure.

Figure 9:
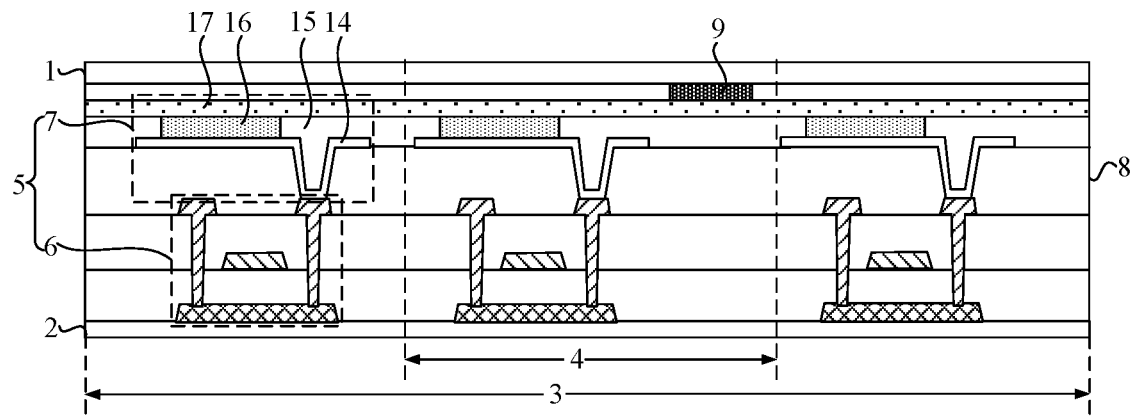
FIG. 9 is a schematic diagram illustrating yet another arrangement of a photosensitive element according to an embodiment of the present disclosure.

FIG. 9 is a schematic diagram illustrating yet another arrangement of a photosensitive element according to an embodiment of the present disclosure. In the embodiment, when the photosensitive element 9 is disposed outside the pixel unit 5, as shown in FIG. 9, the photosensitive element 9 may be disposed on a surface of the first substrate 1 facing the second substrate 2. For example, the photosensitive element 9 can be adhered on the surface of the first substrate 1.

By arranging the photosensitive element 9 directly on the surface of the first substrate 1 facing the second substrate 2, when the display panel is in the photographing mode, loss of the ambient light can be further reduced in the process of the ambient light entering the photosensitive element 9, thereby further improving the imaging quality. In addition, compared with a case in which the photosensitive element 9 is arranged on a surface of the first substrate 1 facing away from the second substrate 2, this embodiment can prevent the photosensitive element 9 from being visible to the human eye.

Further, with reference to FIG. 9, in order to prevent the photosensitive element 9 from blocking the light-emitting layer 16 and affecting the normal display of the display panel, the orthographic projection of the photosensitive element 9 on the second substrate 2 does not overlap with the orthographic projection of the light-emitting layer 16 on the second substrate 2.

Figure 10:
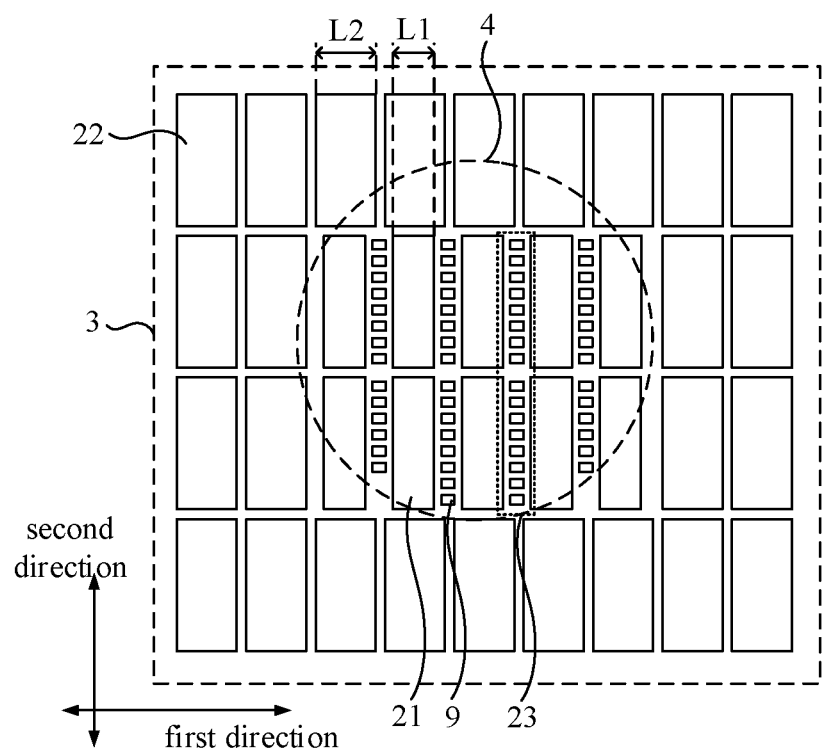
FIG. 10 is another enlarged view of part of FIG. 2.
Figure 11:
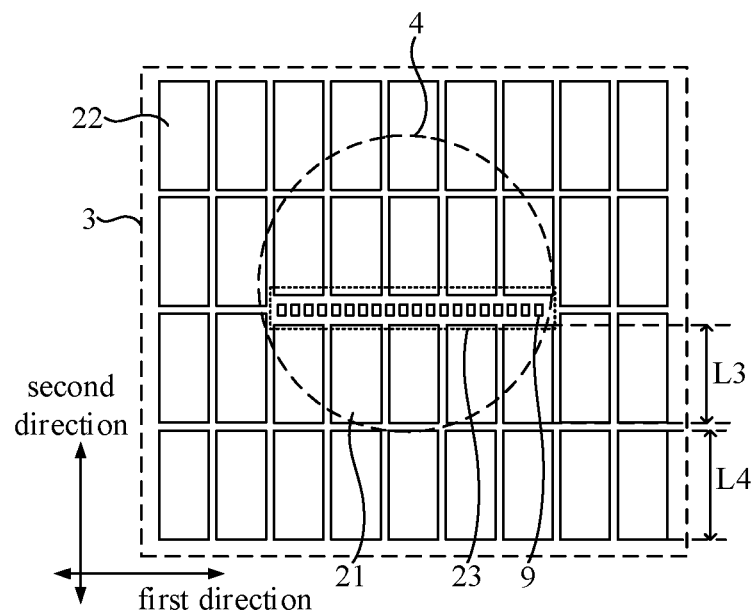
FIG. 11 is still another enlarged view of part of FIG. 2.
Figure 12:
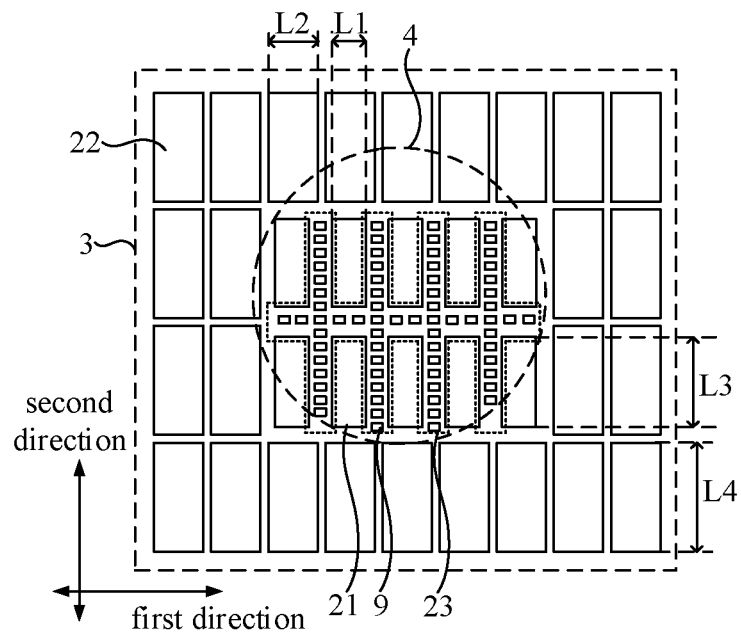
FIG. 12 is yet another enlarged view of part of FIG. 2.

FIG. 10 is another enlarged view of part of FIG. 2, FIG. 11 is still another enlarged view of part of FIG. 2, and FIG. 12 is yet another enlarged view of part of FIG. 2. In an embodiment, as shown in FIGS. 10-12, the plurality of pixel circuits 6 includes a first pixel circuit 21 and a second pixel circuit 22. The first pixel circuit 21 is located in the photographing photosensitive region 4, and the second pixel circuit 22 is located in the display region 3 other than the photographing photosensitive region 4. Besides, a length of the first pixel circuit 21 in a first direction is smaller than a length of the second pixel circuit 22 in the first direction, and/or a length of the first pixel circuit 21 in a second direction is smaller than a length of the second pixel circuit 22 in the second direction. Herein, the first direction intersects with the second direction. A high light transmissive region 23 is formed between two adjacent first pixel circuits 21, and the photosensitive element 9 is disposed correspondingly to the high light transmissive region 23.

It should be noted that, in the manufacturing process of the first pixel circuit 21, an overall size of the first pixel circuit 21 can be reduced by reducing a width of a metal trace, such as scan signal lines, data signal lines, or power signal lines.

Reducing the length of the first pixel circuit 21 in the first direction and/or the second direction can reduce space occupied by the metal trace in the photographing photosensitive region 4, thereby improving the light transmittance of the photographing photosensitive region 4. When the display panel is in the photographing mode, not only an area occupied by the photosensitive element 9 can be increased, but also the amount of light of the ambient light entering the photosensitive element 9 is increased, and thus the imaging quality is improved.

Further, with reference to FIG. 10, the length of the first pixel circuit 21 in the first direction is L1, and the length of the second pixel circuit 22 in the first direction is L2. In order to allow the photographing photosensitive region 4 to have a sufficient light transmission area, L1 and L2 satisfy: $2\ \mu m \leq L2-L1 \leq 10\ \mu m$.

With further reference to FIG. 11, the length of the first pixel circuit 21 in the second direction is L3, and the length of the second pixel circuit 22 in the first direction is L4. In order to allow that the photographing photosensitive region 4 to have a sufficient light transmission area, L3 and L4 satisfy: $2\ \mu m \leq L4-L3 \leq 15\ \mu m$.

In addition, taking FIG. 10 as an example, a plurality of high light transmissive regions 23 has a same length in the first direction, and every two adjacent high light transmissive regions 23 have a same distance with respect to each other, such that light received by the photosensitive element 9 can be more even.

Further, in order to allow the ambient light to be more evenly dispersed so as to be received by the photosensitive elements 9 for further improving the imaging quality, the photosensitive elements 9 are evenly distributed in the high light transmissive region.

It should be noted that the light-emitting layers 16 of a plurality of pixel units 5 may be arranged in a matrix in the display region 3, or may be arranged in a non-matrix manner, that is, a part of the light-emitting layers 16 may be located in the high light transmissive region 23. In this case, in order to prevent the photosensitive element 9 from blocking the light-emitting layer 16 and affecting the normal display of the display panel, the orthographic projection of the photosensitive element 9 in the high light transmissive region 23 on the second substrate 2 does not overlap with the orthographic projection of the light-emitting layer 16 on the second substrate 2.

Further, the anode layer 14 and the cathode layer 17 of the light-emitting element 7 may be made of a transparent conductive material, such as indium tin oxide, indium zinc oxide or indium gallium zinc oxide. Based on a good light transmission performance of the anode layer 14 and the cathode layer 17, blocking of the ambient light by the anode layer 14 and the cathode layer 17 in the high light transmissive region 23 can be reduced, thereby further improving the light transmittance of the high light transmissive region 23.

In an embodiment, with further reference to FIG. 4, in order to achieve normal display, the display panel further includes a polarizer 24 disposed on a surface of the first substrate 1. In order to prevent the polarizer 24 from blocking the photosensitive element 9 and affecting the photographing function, a region in the polarizer 24 corresponding to the photosensitive element 9 is hollowed out. It should be noted that the polarizer 24 may be located on the surface of the first substrate 1 facing the second substrate 2 or located on the surface of the first substrate 1 facing away from the second substrate 2.

Figure 13:
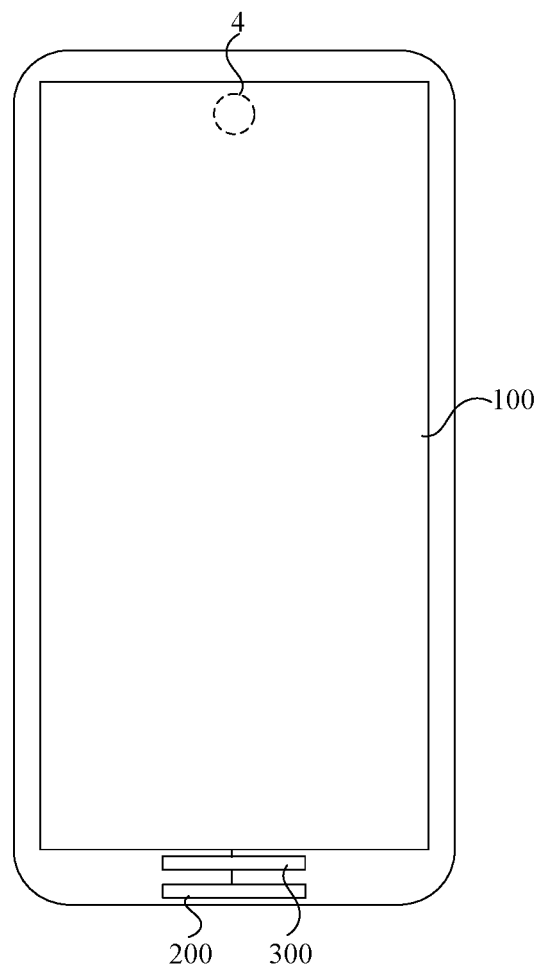
FIG. 13 is a schematic structural diagram of a display device according to an embodiment of the present disclosure.

An embodiment of the present disclosure further provides a display device. FIG. 13 is a schematic structural diagram of a display device according to an embodiment of the present disclosure. As shown in FIG. 13, the display device includes a display panel 100, a mode determining unit 200, and a control unit 300. The structure of the display panel 100 has been described in the above embodiments, and details thereof will not be further described herein. The mode determining unit 200 is configured to determine whether the display panel 100 is in a photographing mode. The control unit 300 is electrically connected to the mode determining unit 200. The control unit 300 is configured to, when the display panel 100 is in the photographing mode, control the pixel units 5 in the display region 3 other than the photographing photosensitive region 4 to emit light, control the pixel units 5 in the photographing photosensitive region 4 not to emit light, and generate an image according to an electrical signal generated by the photosensitive element 9; and when the display panel 100 is not in the photographing mode, control the pixel units 5 in the display region 3 to emit light.

The display device shown in FIG. 13 is merely illustrative, and the display device may be any electronic device having a display function, such as a cellphone, a tablet computer, a notebook computer, an electronic paper book, or a television.

The display device provided by this embodiment of the present disclosure includes the display panel 100. Therefore, with the display device, on the one hand, the photosensitive element 9 does not need to additionally occupy space in the border region, and thus the screen occupancy ratio of the display panel is improved and a narrow border of the display panel can be better achieved. On the other hand, the image display function can be implemented in the photographing photosensitive region 4 when the display panel 100 is not in the photographing mode and the photographing function can be implemented in the photographing mode in the photographing photosensitive region 4. Then, when the display panel displays an image, the image presented in the display region 3 is a complete image, which improves the viewing experience of the user.

In addition, with the display device, when the display panel 100 is in the photographing mode, loss of the ambient light in the process of entering the photosensitive element 9 is reduced, and thus the amount of light received by the photosensitive element 9 is increased, thereby improving the imaging quality.

Figure 14:
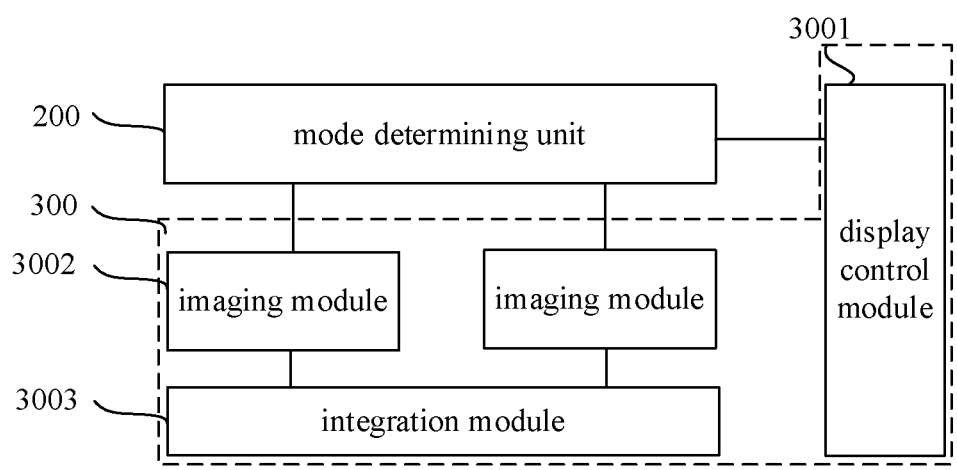
FIG. 14 is a schematic structural diagram of a control unit according to an embodiment of the present disclosure.

FIG. 14 is a schematic structural diagram of a control unit according to an embodiment of the present disclosure. In an embodiment, as shown in FIG. 14, the control unit 300 includes a display control module 3001, an imaging module 3002 and an integration module 3003.

The display control module 3001 is electrically connected to the mode determining unit 300. The display control module 3001 is configured to, when the display panel 100 is in the photographing mode, control the pixel units 5 in the display region 3 other than the photographing photosensitive region 4 to emit light, control the pixel units 5 in the photographing photosensitive region 4 not to emit light; and when the display panel 100 is not in the photographing mode, control the pixel units 5 in the display region 3 to emit light. A plurality of imaging modules 3002 is electrically connected to a plurality of photosensitive elements 9 in one-to-one correspondence (not shown). The plurality of imaging modules 3002 is also electrically connected to the mode determining unit 200. The imaging module 3002 is configured to, when the display panel 100 is in the photographing mode, generate an image corresponding to an electrical signal generated by a corresponding photosensitive element 9. The integration module 3003 is electrically connected to the plurality of imaging modules 3002, and the integration module 3003 is configured to integrate images generated by the plurality of imaging modules so as to generate a complete image.

Since the imaging module 3002 generates an image merely based on the electrical signal generated by the corresponding photosensitive element 9, the image generated by each imaging module 3002 is merely an image corresponding to a partial region, and the complete image can be achieved by further integrating images generated by the plurality of imaging modules by the integration module 3003.

Figure 15:
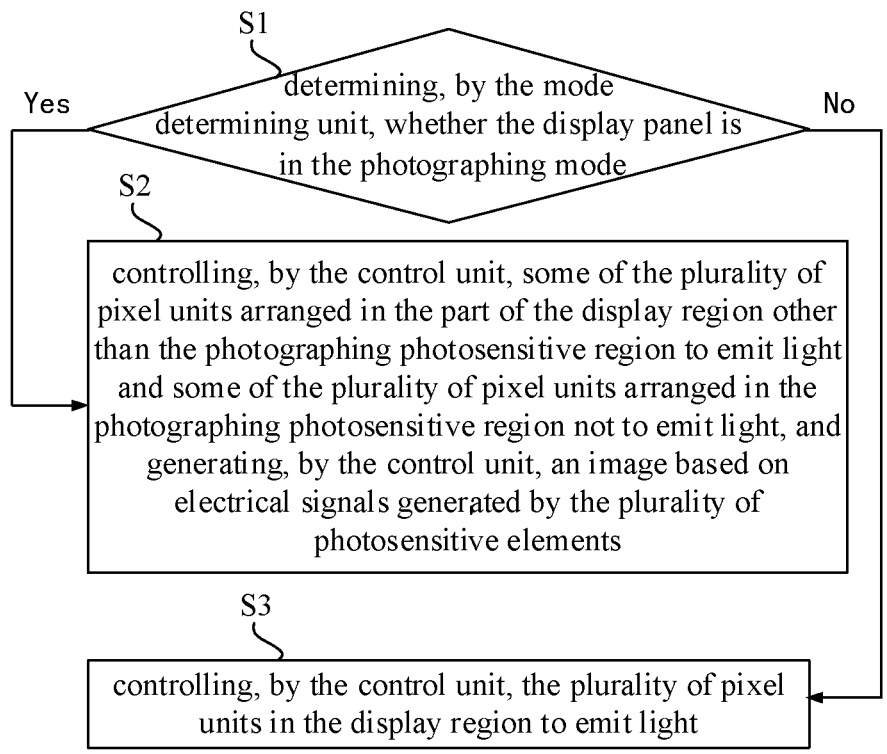
FIG. 15 is a flowchart of a method for driving a display device according to an embodiment of the present disclosure.

An embodiment of the present disclosure further provides a method for driving a display device, which is applied to the abovementioned display device. FIG. 15 is a flowchart of a method for driving a display device according to an embodiment of the present disclosure. As shown in FIG. 15, and combination with FIG. 13, the method for driving the display device include following steps.

At step S1, it is determined by the mode determining unit 200 whether the display panel 100 is in the photographing mode. If yes, the process proceeds to step S2, and if not, the process proceeds to step S3.

At step S2, pixel units 5 in the display region 3 other than the photographing photosensitive region 4 are controlled by the control unit 300 to emit light, pixel units 5 in the photographing photosensitive region 4 are controlled by the control unit 300 not to emit light, and a plurality of images is generated based on respective electrical signals generated by a plurality of photosensitive elements 9.

At step S3, pixel units 5 in the display region 3 are controlled to emit light by the control unit 300.

The method provided by this embodiment of the present disclosure can drive the photographing photosensitive region 4 to achieve the photographing function when it is in the photographing mode and achieve the image display function when it is not in the photographing mode. In this way, when the display panel 100 displays an image, the image presented in the display region 3 is a complete image. Compared with merely achieving the photographing function in the photographing photosensitive region 4, this embodiment can avoid the problem of the poor user viewing experience caused by no image being displayed in the photographing photosensitive region 4.

Figure 16:
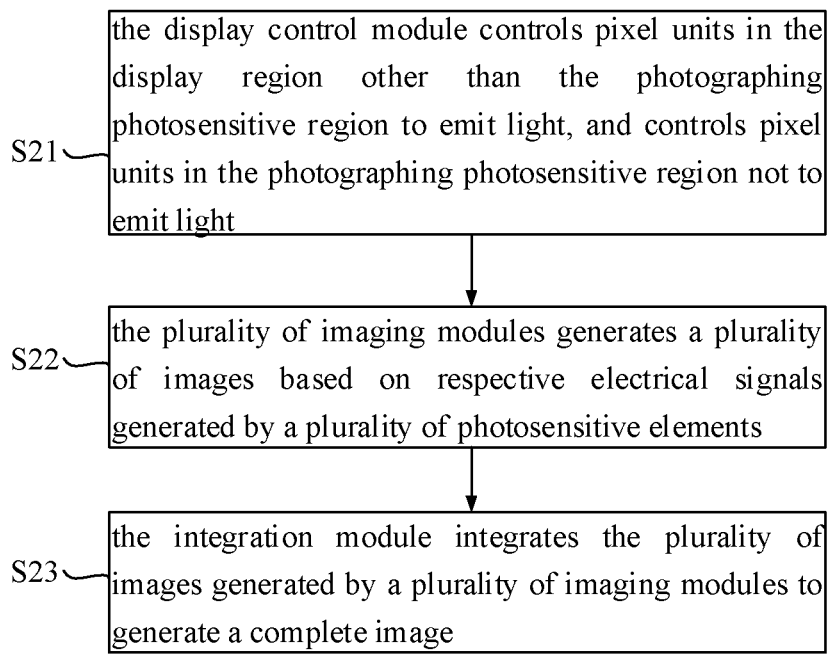
FIG. 16 is a flowchart of step S2 of a method for driving a display device according to an embodiment of the present disclosure.

FIG. 16 is a flowchart of step S2 of a method for driving a display device according to an embodiment of the present disclosure. In combination with FIG. 14, when the control unit 300 includes a display control module 3001, a plurality of imaging module 3002, and an integration module 3003, as shown in FIG. 16, step S2 includes following steps.

At step S21, the display control module 3001 controls pixel units 5 in the display region 5 other than the photographing photosensitive region 4 to emit light, and controls pixel units 5 in the photographing photosensitive region 4 not to emit light.

At step S22, the plurality of imaging modules 3002 generates a plurality of images based on respective electrical signals generated by a plurality of photosensitive elements 9.

At step S23, the integration module 3003 integrates the plurality of images generated by a plurality of imaging modules to generate a complete image.

Since the imaging module 3002 merely generates an image according to the electrical signal generated by the corresponding photosensitive element 9, the image generated by each imaging module 3002 is merely an image corresponding to a partial region, and the complete image can be achieved by further integrating images generated by the plurality of imaging modules by the integration module 3003.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, the display panel having a display region and a partial region of the display region being reused as a photographing photosensitive region, the display panel comprising:
   a first substrate;
   a second substrate disposed opposite to the first substrate;
   a plurality of pixel units disposed in the display region; and
   a plurality of photosensitive elements disposed in the photographing photosensitive region and integrated in the plurality of pixel units,
   wherein the first substrate is located on a side of the second substrate facing a light-emitting surface of the display panel, the plurality of pixel units is formed on the second substrate, each of the plurality of pixel units comprises a pixel circuit and a light-emitting element, and a planarization layer is arranged between the pixel circuit and the light-emitting element, and the plurality of photosensitive elements is located on a side of the planarization layer facing the first substrate,
   wherein the light-emitting element comprises an anode layer, a pixel definition layer, a light-emitting layer and a cathode layer,
   wherein the anode layer is located on a side of the planarization layer facing away from the second substrate, the pixel definition layer is located on a side of the anode layer facing away from the planarization layer, and the cathode layer is located on a side of the pixel definition layer facing away from the second substrate, wherein the pixel definition layer has a first etch hole, the light-emitting layer is located in the first etch hole, the pixel definition layer in the photographing photosensitive region further has a second etch hole, and one of the plurality of photosensitive elements is located in the second etch hole.

2. The display panel according to claim 1, wherein each of the plurality of photosensitive elements comprises a convex lens, an infrared filter, a sensor and a signal transmission line sequentially in a direction from the first substrate towards the second substrate.

3. The display panel according to claim 1, wherein an orthographic projection of the cathode layer in the photographing photosensitive region on the second substrate overlaps with an orthographic projection of the light-emitting layer in the photographing photosensitive region on the second substrate, and wherein the plurality of photosensitive elements is located between the planarization layer and the first substrate.

4. The display panel according to claim 1, wherein the cathode layer is made of a transparent conductive material, and an orthographic projection of the cathode layer on the second substrate covers the display region, and wherein the plurality of photosensitive elements is located between the planarization layer and the cathode layer.

5. The display panel according to claim 1, wherein a portion of the anode layer is located in the second etch hole, an insulation layer is further arranged in the second etch hole, and the insulation layer is located between the one of the plurality of photosensitive elements and the anode layer.

6. The display panel according to claim 1, wherein M photosensitive elements of the plurality of photosensitive elements are integrated in each pixel unit of the plurality of pixel units in the photographing photosensitive region, where $10 \leq M \leq 50$.

7. The display panel according to claim 1, wherein the plurality of pixel units comprises at least two first pixel circuits and a second pixel circuit, wherein the at least two first pixel circuits are located in the photographing photosensitive region, and the second pixel circuit is located in a part of the display region other than the photographing photosensitive region, wherein a length of each of the at least two first pixel circuits in a first direction is smaller than a length of the second pixel circuit in the first direction, and/or a length of each of the at least two first pixel circuits in a second direction is smaller than a length of the second pixel circuit in the second direction, and the first direction intersects with the second direction, and wherein a high light transmissive region is formed between two adjacent first pixel circuits of the at least two first pixel circuits, and at least one of the plurality of photosensitive elements is disposed correspondingly to the high light transmissive region.

8. The display panel according to claim 7, wherein the length of the first pixel circuit in the first direction is L1, and the length of the second pixel circuit in the first direction is L2, where $2\ \mu m \leq L2-L1 \leq 10\ \mu m$.

9. The display panel according to claim 7, wherein the length of the first pixel circuit in the second direction is L3, and the length of the second pixel circuit in the first direction is L4, where $2\ \mu m \leq L4-L3 \leq 15\ \mu m$.

10. The display panel according to claim 7, wherein the at least one of the plurality of photosensitive elements is evenly distributed in the high light transmissive region.

11. The display panel according to claim 7, wherein the light-emitting element comprises an anode layer, a pixel definition layer, a light-emitting layer and a cathode layer, and the anode layer and the cathode layer are made of a transparent conductive material.

12. The display panel according to claim 1, further comprising a polarizer disposed on a surface of the first substrate, and a region in the polarizer corresponding to the plurality of photosensitive elements is hollowed out.

13. A display device, comprising:
the display panel according to claim 1;
a mode determining unit configured to determine whether the display panel is in a photographing mode, and
a control unit electrically connected to the mode determining unit and configured to: when the display panel is in the photographing mode, control some of the plurality of pixel units arranged in a part of the display region other than the photographing photosensitive region to emit light, control some of the plurality of pixel units arranged in the photographing photosensitive region not to emit light, and generate an image according to electrical signals generated by the plurality of photosensitive elements; and when the display panel is not in the photographing mode, control the plurality of pixel units in the display region to emit light.

14. The display device according to claim 13, wherein the control unit comprises:
a display control module electrically connected to the mode determining unit and configured to: when the display panel is in the photographing mode, control some of the plurality of pixel units arranged in the part of the display region other than the photographing photosensitive region to emit light and control some of the plurality of pixel units arranged in the photographing photosensitive region not to emit light; and when the display panel is not in the photographing mode, control the plurality of pixel units in the display region to emit light;
a plurality of imaging modules electrically connected to the plurality of photosensitive elements in one-to-one correspondence and electrically connected to the mode determining unit, and configured to: when the display panel is in the photographing mode, generate a plurality of images based on respective electrical signals generated by the plurality of photosensitive elements; and
an integration module electrically connected to the plurality of imaging modules and configured to integrate the plurality of images generated by the plurality of imaging modules to generate a complete image.

15. A method for diving a display device, applied to the display device according to claim 13, comprising:
step S1 of determining, by the mode determining unit, whether the display panel is in the photographing mode, if yes, proceeding to step S2, and if not, proceeding to step S3;
step S2 of controlling, by the control unit, some of the plurality of pixel units arranged in the part of the display region other than the photographing photosensitive region to emit light and some of the plurality of pixel units arranged in the photographing photosensitive region not to emit light, and generating, by the control unit, an image based on electrical signals generated by the plurality of photosensitive elements; and step S3 of controlling, by the control unit, the plurality of pixel units in the display region to emit light.

16. The method according to claim 15, wherein the control unit comprises a display control module electrically connected to the mode determining unit, a plurality of imaging modules electrically connected to the plurality of photosensitive elements in one-to-one correspondence and electrically connected to the mode determining unit, and an integration module electrically connected to the plurality of imaging modules, wherein the step S2 comprises:

controlling, by the display control module, some of the plurality of pixel units arranged in the part of the display region other than the photographing photosensitive region to emit light and some of the plurality of pixel units arranged in the photographing photosensitive region not to emit light;

generating, by the plurality of imaging modules, a plurality of images based on respective electrical signals generated by the plurality of photosensitive elements; and integrating, by the integration module, the plurality of images generated by the plurality of imaging modules to generate a complete image.

* * * * *